US009989715B2

(12) United States Patent
Hochberg et al.

(10) Patent No.: US 9,989,715 B2
(45) Date of Patent: Jun. 5, 2018

(54) PHOTONIC INTERFACE FOR ELECTRONIC CIRCUIT

(71) Applicant: Coriant Advanced Technology, LLC, New York, NY (US)

(72) Inventors: Michael J. Hochberg, New York, NY (US); Ari Jason Novack, New York, CA (US); Peter D. Magill, Freehold, NJ (US)

(73) Assignee: Elenion Technologies, LLC, New York, NY (US)

( * ) Notice: Subject to any disclaimer, the term of this patent is extended or adjusted under 35 U.S.C. 154(b) by 0 days. days.

(21) Appl. No.: 15/296,709

(22) Filed: Oct. 18, 2016

(65) Prior Publication Data

US 2017/0045697 A1 Feb. 16, 2017

Related U.S. Application Data

(63) Continuation of application No. 14/924,172, filed on Oct. 27, 2015, now Pat. No. 9,500,821.

(60) Provisional application No. 62/141,650, filed on Apr. 1, 2015, provisional application No. 62/068,863, filed on Oct. 27, 2014.

(51) Int. Cl.
*G02B 6/42* (2006.01)
*G02B 6/122* (2006.01)
*H01S 5/00* (2006.01)
*G02B 6/34* (2006.01)
(Continued)

(52) U.S. Cl.
CPC ....... *G02B 6/4243* (2013.01); *G02B 6/12004* (2013.01); *G02B 6/1225* (2013.01); *G02B 6/34* (2013.01); *G02B 6/423* (2013.01); *G02B 6/428* (2013.01); *G02B 6/4224* (2013.01); *G02B 6/4232* (2013.01); *G02B 6/4246* (2013.01); *G02B 6/4278* (2013.01); *H01S 5/0085* (2013.01); *H01S 5/0261* (2013.01); *G02B 6/4214* (2013.01); *G02B 2006/12142* (2013.01)

(58) Field of Classification Search
None
See application file for complete search history.

(56) References Cited

U.S. PATENT DOCUMENTS

| | | |
|---|---|---|
| 5,605,856 A | 2/1997 | Goosen |
| 6,294,018 B1 | 9/2001 | Hamm |

(Continued)

FOREIGN PATENT DOCUMENTS

TW     200636312     10/2006

OTHER PUBLICATIONS

International Search Report, PCT/US2015/057613, dated Jan. 11, 2016, 2 pages.

(Continued)

*Primary Examiner* — Mike Stahl
(74) *Attorney, Agent, or Firm* — Nixon Peabody LLP

(57) ABSTRACT

A photonic interface for an electronic circuit is disclosed. The photonic interface includes a photonic integrated circuit having a modulator and a photodetector, and an optical fiber or fibers for optical communication with another optical circuit. A modulator driver chip may be mounted directly on the photonic integrated circuit. The optical fibers may be placed in v-grooves of a fiber support, which may include at least one lithographically defined alignment feature for optical alignment to the silicon photonic circuit.

19 Claims, 11 Drawing Sheets

(51) Int. Cl.
*H01S 5/026* (2006.01)
*G02B 6/12* (2006.01)

(56) References Cited

U.S. PATENT DOCUMENTS

| | | |
|---|---|---|
| 6,821,802 B2 | 11/2004 | Ahn |
| 7,068,892 B1 | 6/2006 | Lu |
| 7,251,386 B1 | 7/2007 | Dickinson |
| 7,366,380 B1 | 4/2008 | Peterson |
| 7,397,995 B2 | 7/2008 | Blauvelt |
| 8,831,437 B2 | 9/2014 | Dobbelaere |
| 8,971,676 B1 | 3/2015 | Thacker |
| 2001/0009599 A1 | 7/2001 | Kato |
| 2006/0239605 A1 | 10/2006 | Palen |
| 2007/0258683 A1 | 11/2007 | Rolston |
| 2011/0268392 A1 | 11/2011 | Rosenberg |
| 2012/0301149 A1 | 11/2012 | Pinguet |
| 2013/0230278 A1* | 9/2013 | Hung .............. G02B 6/12 385/14 |
| 2013/0241050 A1 | 9/2013 | Levy |
| 2013/0259419 A1 | 10/2013 | Charbonneau-Lefort |
| 2013/0315528 A1* | 11/2013 | Levy .............. G02B 6/425 385/14 |
| 2014/0341506 A1 | 11/2014 | Brenner |
| 2015/0063745 A1 | 3/2015 | Lin |

OTHER PUBLICATIONS

Written Opinion of the International Searching Authority, PCT/US2015/057613, dated Jan. 11, 2016, 7 pages.

Camacho-Aguilera et al., "An Electrically Pumped Germanium Laser", Optics Express, May 7, 2012, vol. 20, No. 10, 5 pages.

Keyvaninia et al., "Demonstration of a Heterogeneously Integrated III-V/SOI Single Wavelength Tunable Laser", Optics Express, Feb. 11, 2013, vol. 21, No. 3, 9 pages.

Watanabe et al., "Silica-Based Optical Interposer for Si Photonics", Photonics Research Group, Department of Information Technology, Ghent University—IMEC, 978-1-4244-4080-1/09, 2009 IEEE, 1 page.

Search Report of the Taiwan Intellectual Property Office in corresponding Taiwanese Patent Application No. 104135323, dated Nov. 9, 2017, 1 page (translation only).

* cited by examiner

PHOTONIC INTERFACE FOR ELECTRONIC CIRCUIT

CROSS-REFERENCE TO RELATED APPLICATIONS

This application is a continuation of U.S. patent application Ser. No. 14/924,172, filed Oct. 27, 2015, now allowed, which claims the benefit of U.S. Provisional Application No. 62/141,650, filed Apr. 1, 2015, and U.S. Provisional Application No. 62/068,863, filed Oct. 27, 2014, each of which is hereby incorporated by reference herein in its entirety.

TECHNICAL FIELD

The present disclosure relates to photonics, and in particular to photonic interfaces for electronic circuits.

BACKGROUND

Computer systems increasingly rely on faster data transfer between individual microelectronic circuits. Recently, silicon microelectronic circuits have become available with tens to hundreds of input and output channels operating at speeds exceeding 10 gigabits per second each. These may include FPGAs, CPUs, and digital switching fabric chips, in particular. Considerable electrical power may be required to drive individual input/output channels, in particular in situations where the channels include long printed circuit board traces and/or long cables.

Recent advances in silicon photonics enable the use of optical interconnects between electronic circuits. Optical interconnects can support very high data transfer rates. Individual optical channels are currently be modulated at rates reaching 40 gigabits per second and higher. Wavelength division multiplexing (WDM) may be used to provide multiple wavelength channels in a single optical fiber, and a plurality of optical fibers may be used to provide even more bandwidth.

Optical interconnects must provide, for each wavelength channel, modulation and electro-optical conversion at the transmitter end and demodulation and optoelectronic data conversion at the receiver end of a communication link. To provide this functionality prior to this invention, an optical interconnect may require multiple separate devices such as modulators, detectors, drivers, lasers, etc. The resulting optical interconnects are often bulky, complex, costly, and may draw considerable amounts of electrical energy to operate, negating many advantages of optical interconnects. Furthermore, as with many fiber-based optical devices, active alignment of optical fibers may be required. Active optical alignment is time-consuming, and therefore expensive in mass production.

SUMMARY

In accordance with an aspect of the disclosure, there is provided a photonic interface assembly for an electronic circuit, the photonic interface assembly comprising:

a first electrical port for receiving a first electrical signal from the electronic circuit, and a second electrical port for coupling a second electrical signal to the electronic circuit;

at least one optical fiber for outputting a first optical signal, receiving a second optical signal, or both outputting the first optical and receiving the second optical signal;

a photonic integrated circuit comprising:

an optical modulator for modulating an optical carrier wave with the first electrical signal to provide the first optical signal, and a photodetector for providing the second electric signal in response to the second optical signal; and a fiber support attached to the photonic integrated circuit and supporting the at least one optical fiber.

In one exemplary embodiment, the fiber support includes at least one groove structure supporting the at least one optical fiber. Two or more optical fibers may be provided for separately propagating the first and second optical signals. At least one of the fiber support and the photonic integrated circuit may include a lithographically defined registration feature extending between the fiber support and the photonic integrated circuit for vertical alignment of the fiber support relative to the photonic integrated circuit. In one embodiment, a modulator driver chip is mounted on the photonic integrated circuit and electrically coupled to the photonic integrated circuit for driving the optical modulator. An optical gain chip, such as a semiconductor optical amplifier (SOA) chip, may be attached to the silicon photonic chip and optically coupled to the optical modulator for providing the optical carrier wave, or for amplifying an optical carrier wave. At least one of the optical gain chip and the photonic integrated circuit may include a lithographically defined registration feature extending between the optical gain and the photonic integrated circuit for vertical and, optionally, horizontal alignment of the optical gain chip relative to the photonic integrated circuit.

A substrate may be provided. The photonic integrated circuit may be attached to the substrate e.g. with a plurality of microball or microbump contacts for contacting the first and second electrical ports. Alternatively, the photonic integrated circuit may be attached mechanically to the substrate with solder or epoxy and attached electrically with wire bonds to the first and second electrical ports.

In accordance with the disclosure, there is further provided a method for providing a photonic interface for an electronic circuit, the method comprising:

providing a photonic integrated circuit comprising an optical modulator and a photo detector;

supporting at least one optical fiber in a fiber support attached to the photonic integrated circuit, wherein the at least one optical fiber is configured for outputting a first optical signal, receiving a second optical signal, or both outputting the first optical and receiving the second optical signal;

receiving a first electrical signal from the electronic circuit, and providing the first electrical signal to the modulator;

modulating an optical carrier wave with the first electrical signal to provide the first optical signal; and detecting the second optical signal with the photodetector, to provide a second electric signal, and coupling the second electrical signal to the electronic circuit.

The fiber support and/or the optical gain chip may be aligned relative to the silicon photonic chip using at least one lithographically defined hard stop.

BRIEF DESCRIPTION OF THE DRAWINGS

Exemplary embodiments will now be described in conjunction with the drawings, in which.

DETAILED DESCRIPTION

While the present teachings are described in conjunction with various embodiments and examples, it is not intended that the present teachings be limited to such embodiments. On the contrary, the present teachings encompass various alternatives and equivalents, as will be appreciated by those of skill in the art.

Figure 1A:
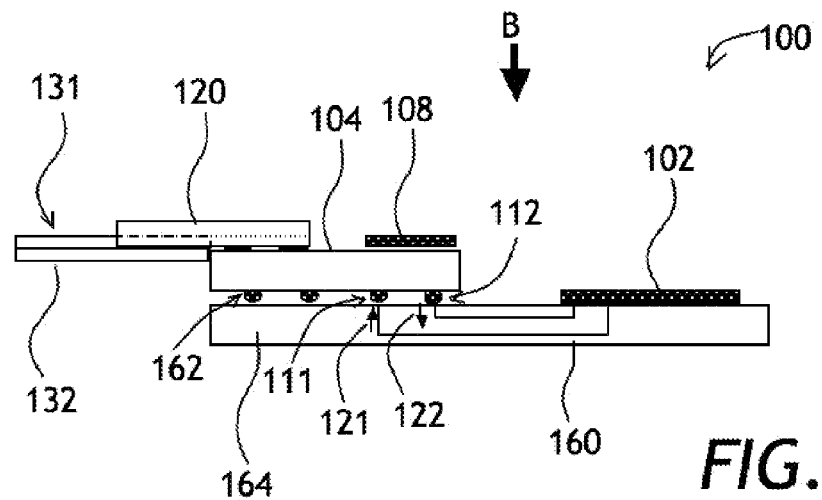
FIG. 1A is a schematic side view of a photonic interface assembly of the present disclosure.
Figure 1B:
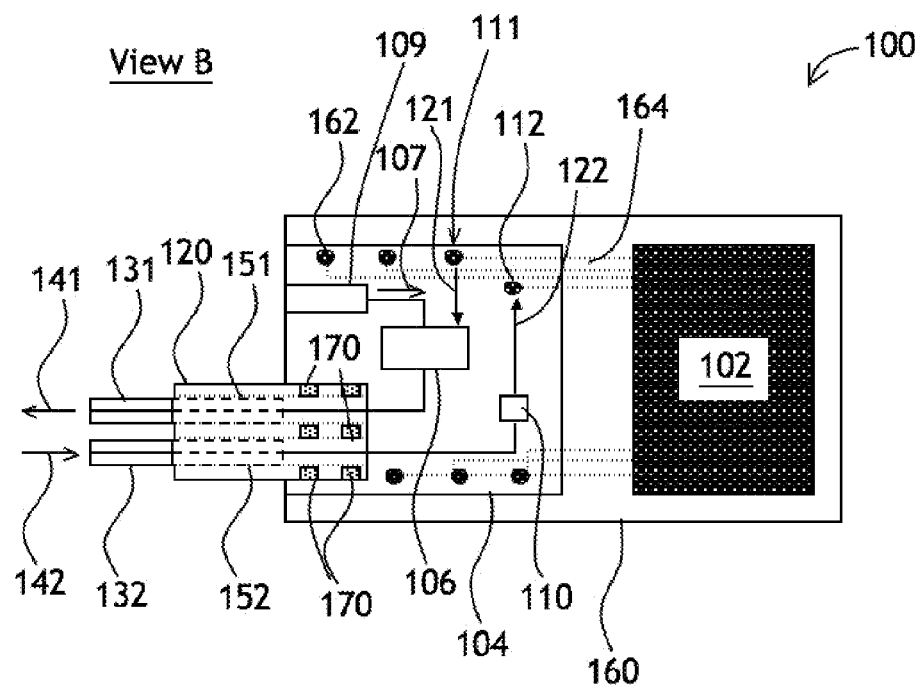
FIG. 1B is a schematic plan view of the photonic interface assembly of FIG. 1A.

Referring to FIGS. 1A and 1B, a photonic interface assembly 100 for an electronic circuit 102 may provide optical communication with an external device (not shown) such as another photonic interface assembly, a transceiver, etc. For the purposes of communication with the electronic circuit 102, the photonic interface assembly 100 may include a first electrical port 111 for receiving a first electrical signal 121 from the electronic circuit 102, and a second electrical port 112 for coupling a second electrical signal 122 to the electronic circuit 102. The first 111 and second 112 electrical ports may include, for example, microball or microbump electrical contacts or wirebonds. For optical communication with the external device, a first 131 and a second 132 optical fibers may be provided. The first optical fiber 131 may output a first optical signal 141 (FIG. 1B) to the external device, and the second optical fiber 132 may receive a second optical signal 142 from the external device. A single optical fiber might be used for propagating both the first 141 and second 142 optical signal in opposite directions. More generally, at least one optical fiber may be provided for outputting the first optical signal 141, receiving the second optical signal 142, or for both outputting the first optical signal 141 and receiving the second optical signal 142. When two optical fibers 131 and 132 are provided, the first optical fiber 131 may be used for outputting the first optical signal 141, and the second optical fiber 132 may be used for receiving the second optical signal 142, as shown in FIGS. 1A and 1B. In one embodiment, each one of the first 131 and second 132 optical fibers may be used for bidirectional propagation of optical signals therein. More than two, e.g. four, eight, or more optical fibers may be provided, as required, each of which may be used for bidirectional or unidirectional propagation of optical signals.

The photonic interface assembly 100 further includes a photonic integrated circuit, e.g. a silicon photonic chip 104 having an optical modulator 106 for modulating an optical carrier wave 107 with the first electrical signal 121 to provide the first optical signal 141, and a photodetector 110 for receiving the second optical signal 142. The photodetector 110 may be optically coupled to the second optical fiber 132. In operation, the photodetector 110 provides the second electric signal 122 in response to the second optical signal 142. In the case of bidirectional communication over the first optical fiber 131, both the optical modulator 106 and the photodetector 110 are optically coupled to the optical fiber 131. A preamplifier e.g. a transimpedance amplifier, not shown, may be used to amplify the second electrical signal 122.

The silicon photonic chip 104 may be supported by an optional substrate 160, such as a printed circuit board (PCB), a multi-layer ceramic carrier, etc. The silicon photonic chip 104 may be electrically coupled to the substrate 160 via a plurality of microball or microbump contacts 162, which are electrically coupled to the electronic circuit 102 by traces 164 on or within the substrate 160. Wirebonds, not shown, may also be used for this purpose. The silicon photonic chip 104 may further include other waveguide-based optical devices for processing of the first 141 and/or second 142 optical signals, such as an optical filter e.g. a ring waveguide filter, an optical switch including a wavelength-selective switch, a wavelength division multiplexor such as arrayed waveguide grating (AWG) or others, a polarization multiplexor, etc. The silicon photonic chip 104 may include a plurality of optical modulators 106 and a plurality of photodetectors 110 for multi-channel operation. The plurality of communication channels may include one or more of multiple communication wavelengths and multiple optical fibers. The substrate 160 may support a plurality of one photonic chips 104, each of which may contain the elements for communication over one or more of multiple communication wavelengths and multiple optical fibers.

The optical carrier wave 107 may be provided by an optional optical gain chip, e.g. a SOA chip 109 attached to the silicon photonic chip 104 and optically coupled to the optical modulator 106. The optical gain/SOA chip 109 may be used as an optical gain medium in a laser for generating the optical carrier wave 107. The optical carrier wave 107 may also be externally generated, with or without amplification by the SOA chip 109. A modulator driver chip 108 (FIG. 1A, omitted in FIG. 1B to show the underlying structure) may be provided. The modulator driver chip 108 may be attached to the silicon photonic chip 104 and electrically coupled to the silicon photonic chip 104, e.g. with microball or microbump contacts or wirebonds, for driving the optical modulator 106 for providing modulation of the optical carrier wave 107 in dependence on the first electrical signal 121. The optical modulator 106 may be optically coupled to the first optical fiber 131 for outputting the first optical signal 141. The silicon photonic chip 104 may support a plurality of gain chips/SOAs 109. Each gain chip/SOA 109 may include a plurality of waveguides each of which would be used to produce a different optical carrier wave 107. In another embodiment, the first electrical signal 121 may directly modulate the source of the optical carrier wave 107 by modulating the current injected into the gain chip/SOA 109, creating the first optical signal 141 without the use of an optical modulator 106. In yet another embodiment, the optical modulator 106 may be integrated in the gain chip/SOA 109.

For ease of assembly, a fiber support 120 may be provided. The fiber support 120 supports the first 131 and the second 132 optical fiber and may include first 151 and second 152 v-grooves for supporting the first 131 and second 132 optical fibers, respectively. The fiber support 120 may be attached to the silicon photonic chip 104. In a preferred embodiment, the fiber support 120 may include at least one lithographically defined registration feature 170 (six are shown in FIG. 1B) extending towards the silicon photonic chip 104 for precise vertical alignment of the fiber support 120 relative to the silicon photonic chip 104. Herein, the term "vertical" means perpendicular to a plane of the silicon photonic chip 104, that is, to a plane parallel to thin film layers of the silicon photonic chip 104. In one embodiment, the registration feature 170 includes a dielectric or semiconductor hard stop. The fiber support 120 may be attached to the silicon photonic chip 104 by a solder joint, not shown, disposed adjacent the registration feature 170. The first 151 and second 152 v-grooves may be replaced with a single v-groove, and the first 131 and second 132 optical fibers may be replaced with a single optical fiber for bidirectional propagation of the first 141 and second 142 optical signals in the single optical fiber. The photonic interface assembly 100 may include a plurality of fiber supports 120, each of which may support a plurality of optical fibers 131.

Figure 2:
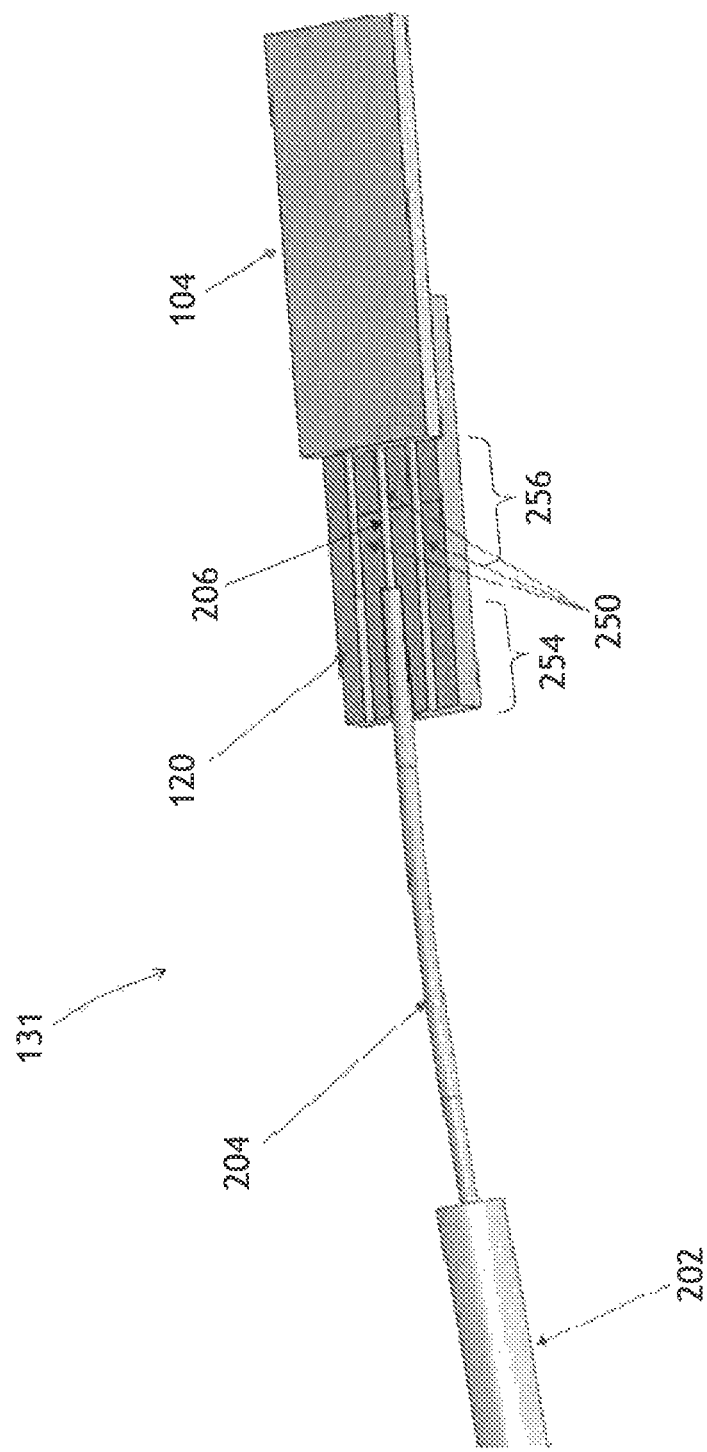
FIG. 2 is a three-dimensional view of a fiber support attached to a silicon photonic chip.

The attachment of optical fibers to the photonic interface assembly 100 is further illustrated in FIG. 2, which is shown inverted as compared to FIG. 1. Only the first optical fiber 131 is shown for brevity. The first optical fiber 131 may include a fiber jacket 202 surrounding a layer of polymer coatings 204, which protects a glass fiber 206. V-grooves 250 of the fiber support 120 may include wide sections 254 for accommodating the coatings 204, and narrow sections 256 for supporting the fiber 206. Other groove shapes, e.g. a U-shape, rectangular, etc., may be used.

Figure 3:
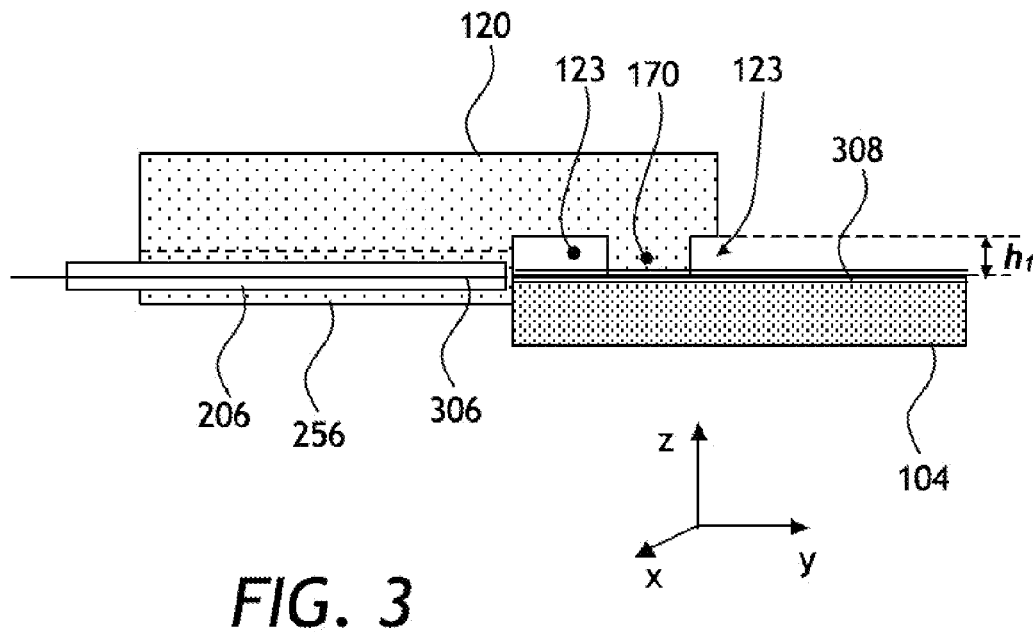
FIG. 3 is a schematic side cross-sectional view of the fiber support of FIG. 2 showing registration features for passive alignment.

The mounting of the fiber support 120 on the silicon photonic chip 104 is further illustrated in FIG. 3. The narrow v-groove sections 256 may be precision micromachined, or otherwise formed for example using a KOH etch of crystal facets, by wet etching, by dry etching, and the like. The narrow v-groove sections 256 may be v-shaped, u-shaped, or have another shape in cross-section, as long as the narrow groove sections 256 hold the first optical fiber 131 in place at a well-defined location on the fiber support 120. The registration feature 170 may be obtained e.g. by growth of a dielectric or semiconductor to a precisely defined thickness and then formed lithographically by etching recesses 123 in the fiber support 120, to match optional registration features, not shown, lithographically etched in the silicon photonic chip 104. Height $h_1$ of the registration feature 170 is determined by deposited layer thickness and, as such, may be very precise, e.g. to a thickness of 0.01 micrometer or better. The optional registration features in the silicon photonic chip 104 are preferably shorter than the height $h_1$. The position of the registration feature 170 in the horizontal x-direction may be very accurately determined by lithographically etched recesses in the silicon photonic chip 104.

Therefore, the position of the optical fiber 206 (and, therefore, the core 306) may be defined with high precision, potentially enabling passive placement of the fiber support 120 in the x-direction and/or the vertical z-direction perpendicular to the silicon photonic chip 104, that is, perpendicular to the plane of the deposited layers on the silicon photonic chip 104. The required accuracy in the y-direction is typically less than in the x- and z-directions, and may be provided without requiring active optical alignment, for example using a pick-and-place machine, not shown.

The positioning of the first optical fiber 131 in the narrow section 256 enables a passive optical alignment with waveguide 308 of the silicon photonic chip 104. The silicon photonic chip 104 may also include a similar registration feature or features extending in the z-direction towards the fiber support 120. More generally, at least one of the fiber support 120 and the silicon photonic chip 104 may include at least one lithographically defined registration feature extending between the fiber support 120 and the silicon photonic chip 104 for vertical, that is, z-direction, alignment of the fiber support 120 relative to the silicon photonic chip 104 and optionally for alignment in the x-direction which is in the plane of the deposited layers on the silicon photonic chip 104. To that end, the registration feature 170 may be implemented as a dielectric or semiconductor hard stop having an edge parallel to YZ-plane, that is, the plane of FIG. 3, for horizontal alignment of the fiber support 120 in the x-direction relative to the silicon photonic chip 104.

Figure 4:
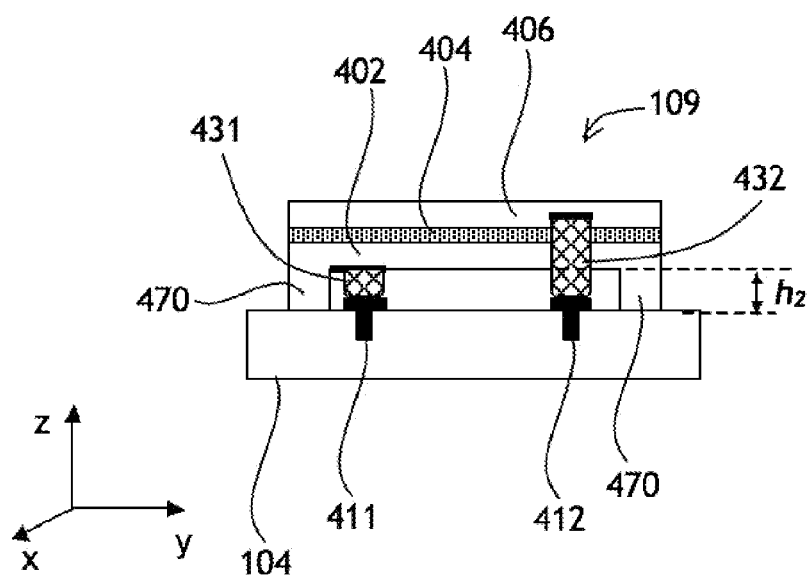
FIG. 4 is a schematic side cross-sectional view of an SOA chip mounted and vertically aligned to a silicon photonic chip by means of registration features.

The mounting of the optional SOA chip 109 on the silicon photonic chip 104 is illustrated in FIG. 4. In the embodiment shown in FIG. 4, the SOA chip 109 includes a lower cladding layer 402, a core layer 404, an upper cladding layer 406, and at least one lithographically defined registration feature, such as semiconductor or dielectric hard stop 470. The hard stops 470 extend towards the silicon photonic chip 104 for vertical alignment of the SOA chip 109 relative to the silicon photonic chip 104. Height $h_2$ of the registration features 470 is determined by deposited layer thickness, and may be very precise. The silicon photonic chip 104 may include optional registration features for positioning against a horizontal edge of the hard stops 470 extending in the x-direction. Accordingly, the position of the core layer 404 of the SOA chip 109 may be defined with a high precision in at least one of, and preferably both z- and x-directions, enabling passive placement of the SOA chip 109 in a critical vertical z-direction perpendicular to the silicon photonic chip 104, as well as in x-direction as shown in FIG. 4. The required accuracy in the y-direction is typically less than in the z- and x-directions, and may be provided without requiring active optical alignment, for example using a pick-and-place machine, not shown. More generally, at least one of the SOA chip 109 and the silicon photonic chip 104 may include a lithographically defined registration feature extending between the SOA chip 109 and the silicon photonic chip 104 for at least one of z- or x-direction alignment of the SOA chip 109 relative to the silicon photonic chip 104. In the embodiment shown in FIG. 4, the silicon photonic chip 104 includes electrical contacts 411 and 412 electrically attached to the lower 402 and upper 406 cladding layers of the SOA chip 109 by respective solder joints 431 and 432 optionally disposed adjacent to the hard stops 470. In other words, the hard stops 470 function as alignment features allowing a passive sub-micron alignment of the SOA chip 109 in at least one of the horizontal and vertical directions, while the solder joints 431 and 432 function both as electrical coupling and mechanical attachment means for connecting the SOA chip 109 to the silicon photonic chip 104.

Figure 5:
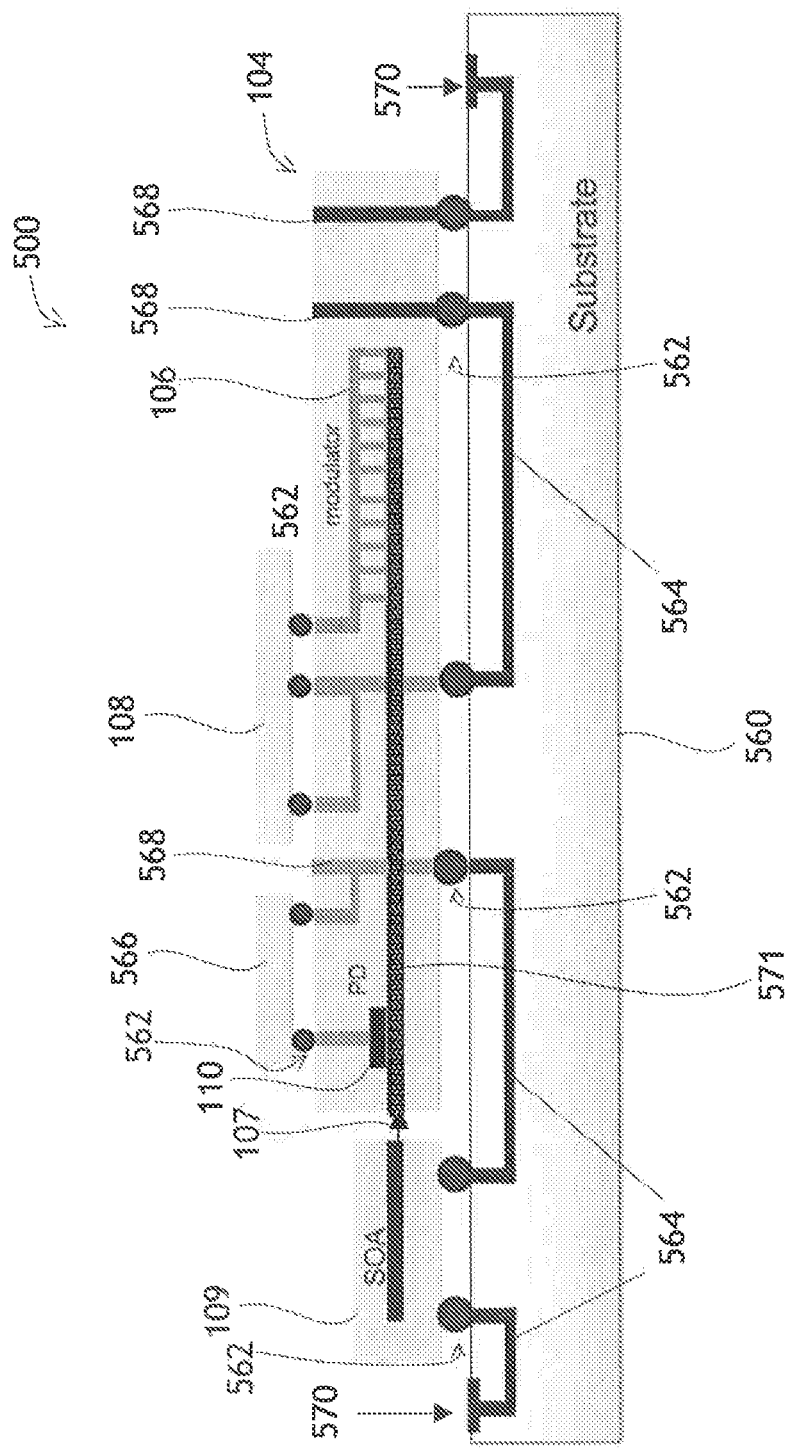
FIG. 5 is a schematic side cross-sectional view of the photonic interface assembly of FIGS. 1A and 1B including an externally mounted SOA chip on a substrate.

Various exemplary embodiments of the photonic interface assembly 100 of FIGS. 1A and 1B will now be considered. Referring to FIG. 5, a photonic interface assembly 500 includes a substrate 560, the silicon photonic chip 104, and the SOA chip 109 connected to the substrate 560 with a plurality of microball or microbump contacts 562. For providing the optical carrier wave 107, the SOA chip 109 is optically coupled to the waveguide 571 that in turn is optically coupled to the optical modulator 106. In another embodiment, a hybrid laser may be assembled from the SOA chip 109 and partially reflective optical elements (not shown) on the silicon photonic chip 104. The optical carrier wave 107 output from the partially reflective optical elements is optically coupled to a waveguide 571 that in turn is optically coupled to the optical modulator 106. An electrical preamplifier chip 566, for example a bipolar transimpedance amplifier (TIA), may be connected to the silicon photonic chip 104 with microball or microbump contacts 562 and electrically coupled to the photodetector 110 for amplifying the second electrical signal 122 (FIG. 1B) provided by the photodetector 110. The modulator driver 108 may be connected to the silicon photonic chip 104 with microball or microbump contacts 562 and electrically coupled to the modulator 106 for modulating an optical carrier wave 107 with the first electrical signal 121 (FIG. 1B). The electrical preamplifier chip 566 and the modulator driver 108 may be combined in a single electronic chip. The necessary electrical connections between various components may be provided by traces 564 (FIG. 5) and metal pillars 568. Alternatively, the necessary electrical connections between various components may be provided by wirebonds. External contacts 570 may be provided for mounting an electrical connector, not shown.

Figure 6:
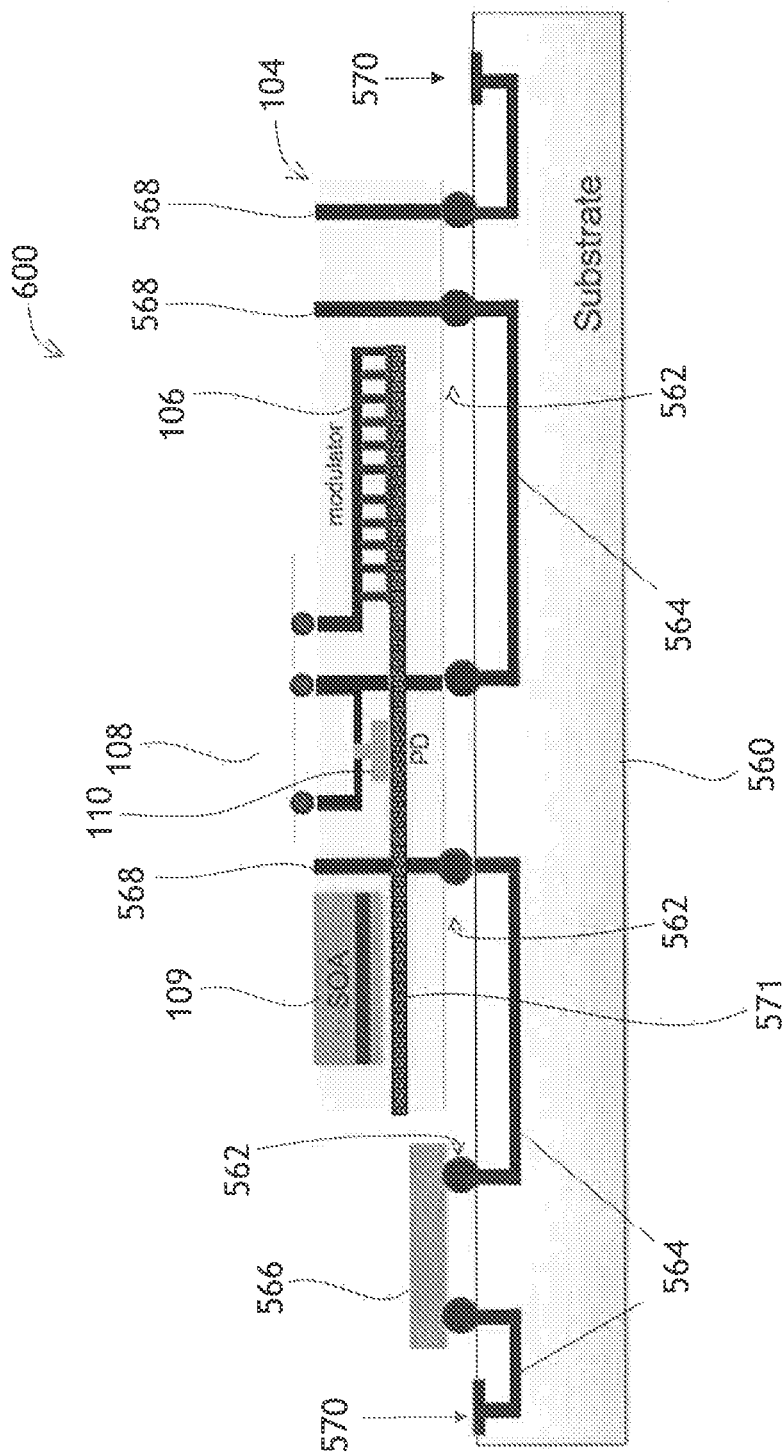
FIG. 6 is a schematic side cross-sectional view of the photonic interface assembly of FIGS. 1A and 1B including an SOA chip sunk into the silicon photonic chip.

Turning to FIG. 6, a photonic interface assembly 600 is a variant of the photonic interface assembly 500 of FIG. 5. The photonic interface assembly 600 of FIG. 6 has the electrical preamplifier chip 566 attached to the substrate 560 with a plurality of microball or microbump contacts 562. Another distinction of the photonic interface assembly 600 is that the SOA chip 109 is sunk into the silicon photonic chip 104. Alternatively, the electrical preamplifier chip 566 could be attached to the substrate 560 with one of eutectic bonding, soldering, epoxy or other attachment mechanisms. The electrical connections from electrical preamplifier chip 566 to photodetector 110 on the silicon photonic chip 104 could be via wirebonds.

Figure 7:
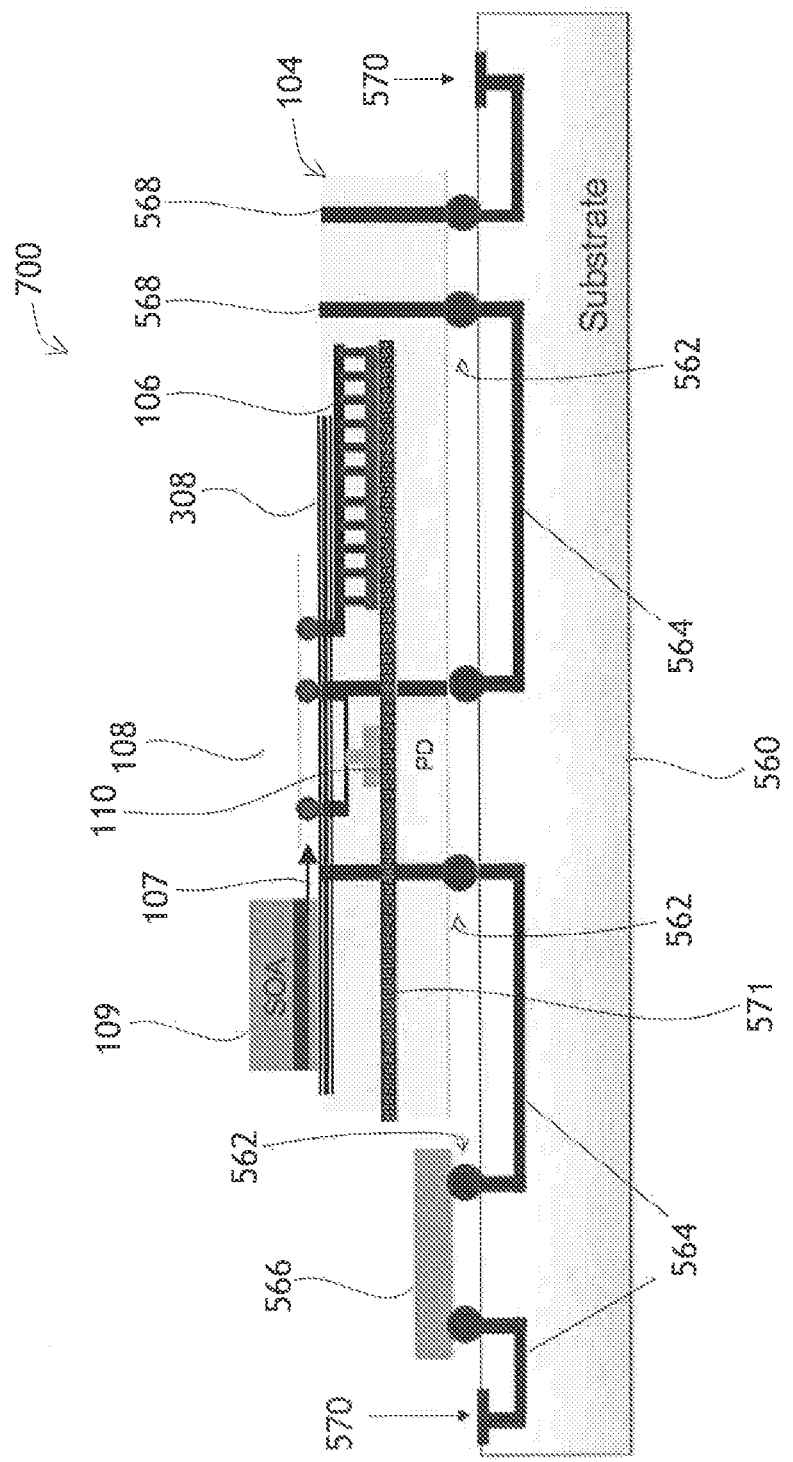
FIG. 7 is a schematic side cross-sectional view of the photonic interface assembly of FIGS. 1A and 1B including an SOA chip evanescently coupled to the modulator.

Referring to FIG. 7, a photonic interface assembly 700 is a variant of the photonic interface assembly 600 of FIG. 6. The photonic interface assembly 700 of FIG. 7 has the SOA chip 109 disposed for evanescent optical coupling to the waveguide 308 of the optical modulator 106 for providing the optical carrier wave 107 to the optical modulator 106.

Figure 8:
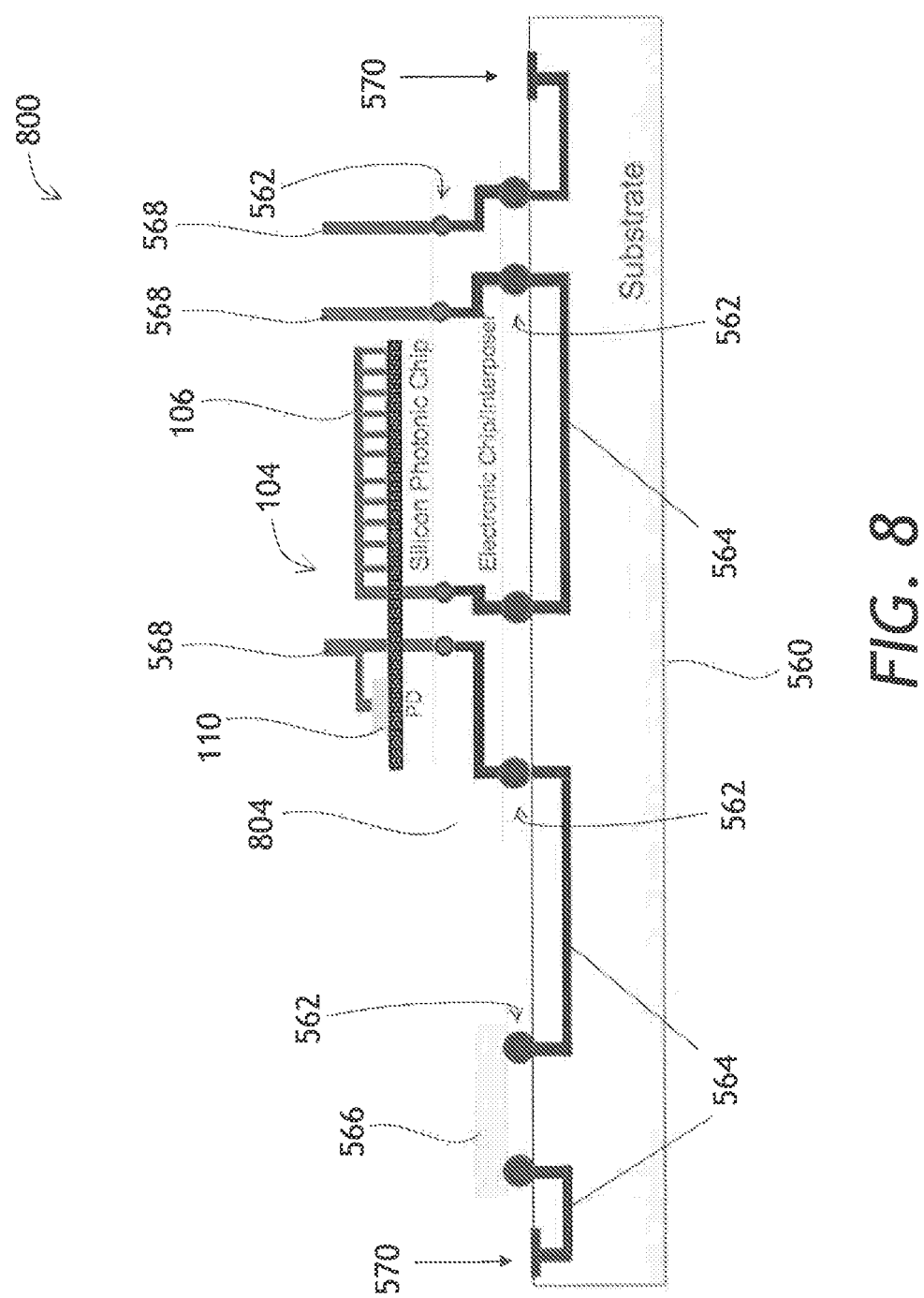
FIG. 8 is a schematic side cross-sectional view of the photonic interface assembly of FIGS. 1A and 1B including an electronic interposer chip.

Turning to FIG. 8, a photonic interface assembly 800 is a variant of the photonic interface assembly 100 of FIGS. 1A and 1B. The photonic interface assembly 800 of FIG. 8 includes an electronic interposer chip 804 disposed between the silicon photonic chip 104 and the substrate 560. The electronic interposer chip 804 may include circuitry required for operation of various components of the silicon photonic chip 104, such as a driver of the optical modulator 106, demodulator circuitry, etc. There may be a plurality of electronic interposer chips 804 mounted on the substrate 560.

Figure 9:
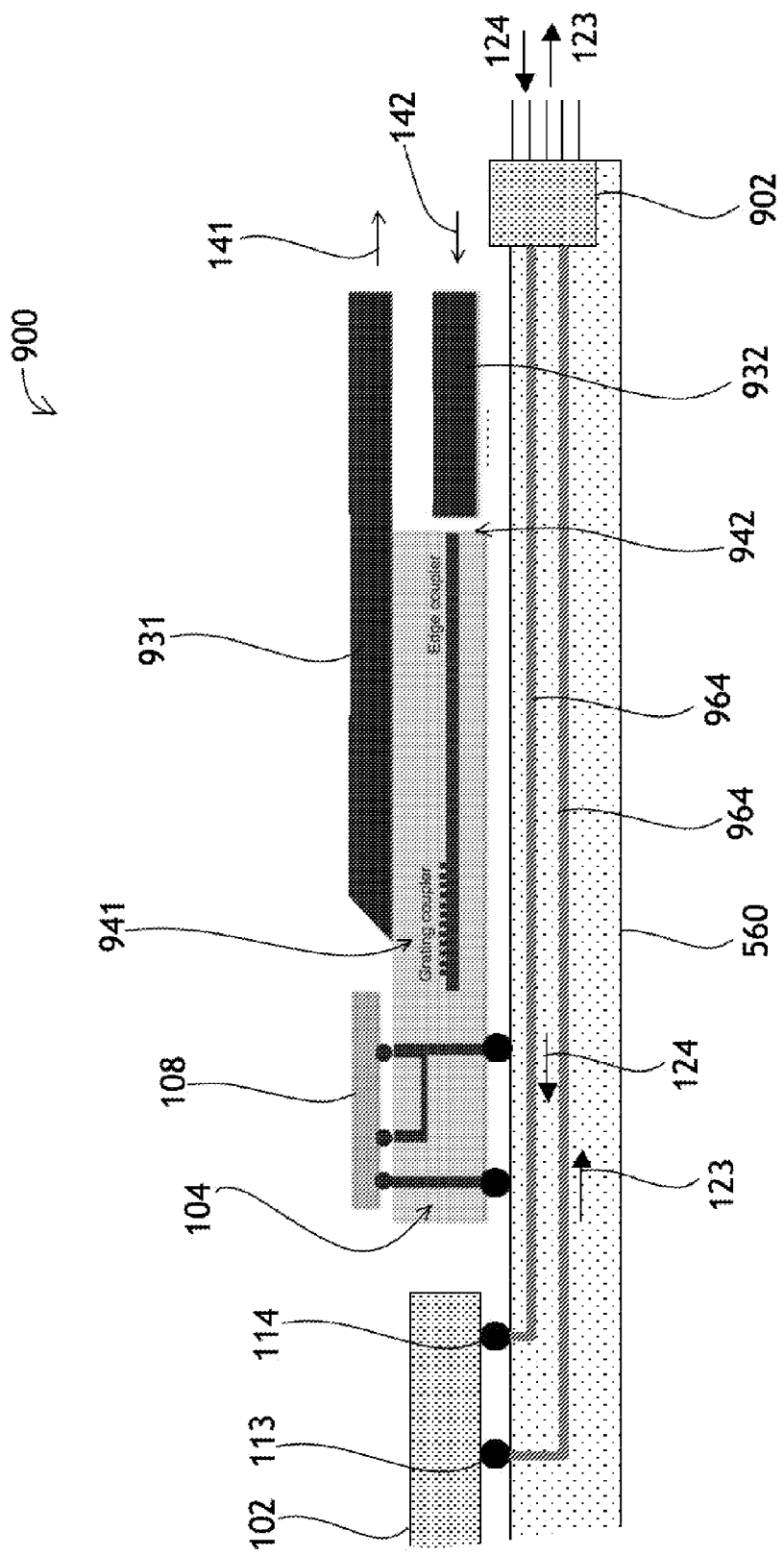
FIG. 9 is a schematic side cross-sectional view of the photonic interface assembly of FIGS. 1A and 1B including optical fibers directly attached to the silicon photonic chip, and an arrayed connector for electrical coupling to an external electronic device.

Referring now to FIG. 9, a photonic interface assembly 900 is a variant of the photonic interface assembly 100 of FIGS. 1A and 1B. The photonic interface assembly 900 of FIG. 9 may include an angle-polished first optical fiber 931 optically coupled to the silicon photonic chip 104 by a grating coupler 941 for outputting the first optical signal 141, and the second optical fiber 932 optically coupled to the silicon photonic chip 104 by an edge coupler 942 for receiving the second optical signal 142. In another embodiment a photonic interface assembly 900 may include the first optical fiber 931 optically coupled to the silicon photonic chip 104 by the grating coupler 941 for receiving the second optical signal 142, and the second optical fiber 932 optically coupled to the silicon photonic chip 104 by the edge coupler 942 for outputting the first optical signal 141. Other embodiments may use only grating couplers, while still other embodiments may use only edge couplers.

The photonic interface assembly 900 may further include a third electrical port 113 on the substrate 560 for receiving a third electrical signal 123 from the electronic circuit 102, and a fourth electrical port 114 on the substrate 560 for sending a fourth electrical signal 124 to the electronic circuit 102. An arrayed electrical connector 902 may be attached to the substrate 560 and electrically coupled to the third 113 and fourth 114 electrical ports by electrical traces 964 for connection to an external electronic unit, not shown. Thus, the communication with the external unit, e.g. another PCB and/or another remote host, may be performed by means of both the first 141 and second 142 optical signals, and/or third 123 and fourth 124 electrical signals, which may provide a greater flexibility of communication.

Figure 10:
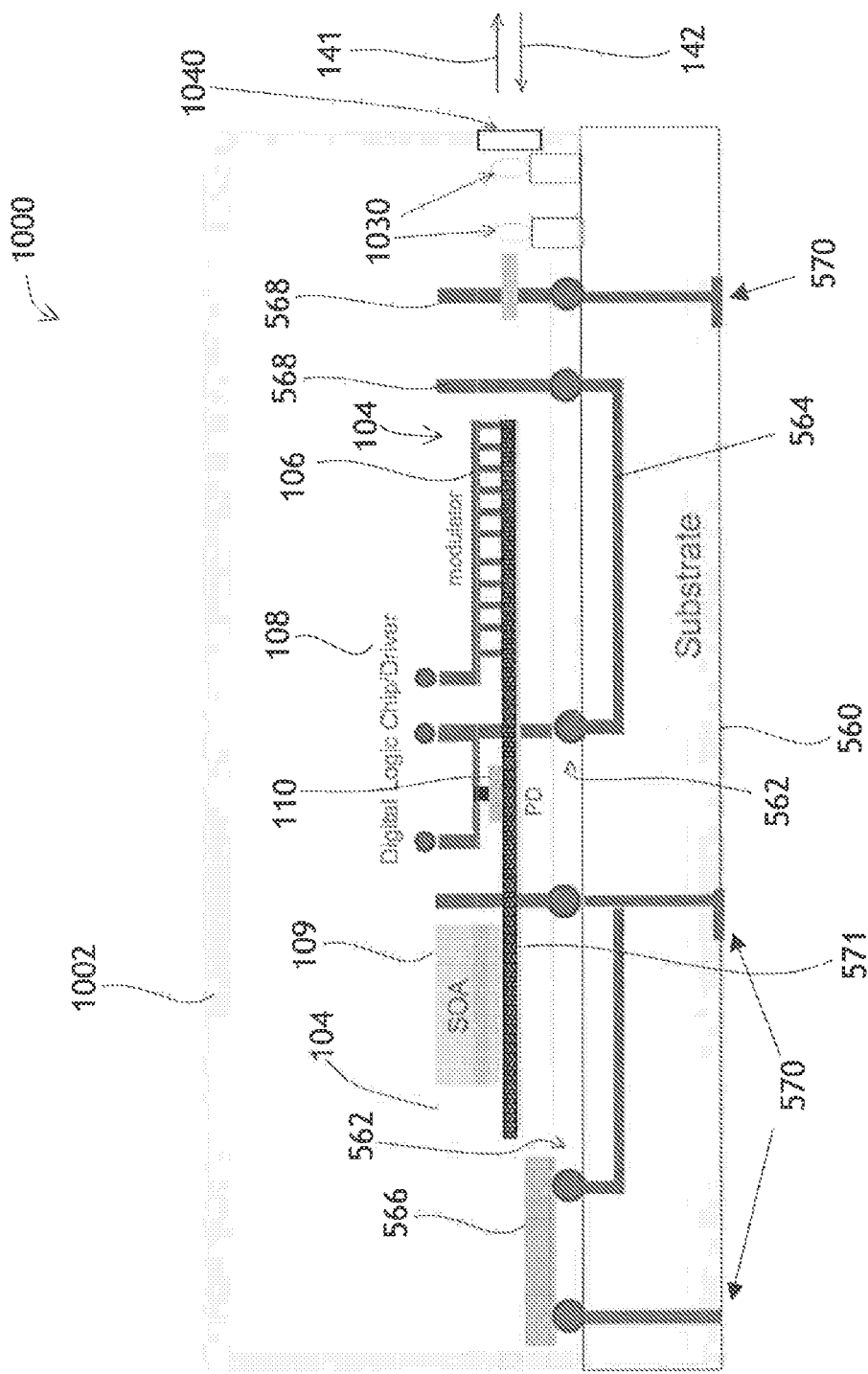
FIG. 10 is a schematic side cross-sectional view of the photonic interface assembly of FIGS. 1A and 1B including a free-space optically coupled silicon photonic chip.

Turning to FIG. 10, a photonic interface assembly 1000 is a free-space coupled variant of the photonic interface assembly 600 of FIG. 6. The photonic interface assembly 1000 of FIG. 10 includes a hermetic package 1002 for hermetically enclosing the silicon photonic chip 104, the optical modulator 106, the modulator driver 108, the SOA chip 109, and the electrical preamplifier 566. The photonic interface assembly 1000 may further include lenses 1030 and a window 1040 for transmission of the first 141 and second 142 optical signals across the hermetic package 1002. External contacts 570 may be provided on a bottom side of the substrate 560. The window 1040 may be constructed from one of the lenses 1030. The free-space coupling optics comprising one or more lenses 1030 and an optional window 1040 may be used to convey a single optical signal 141 or multiple optical signals 141, 142, etc.

Figure 11:
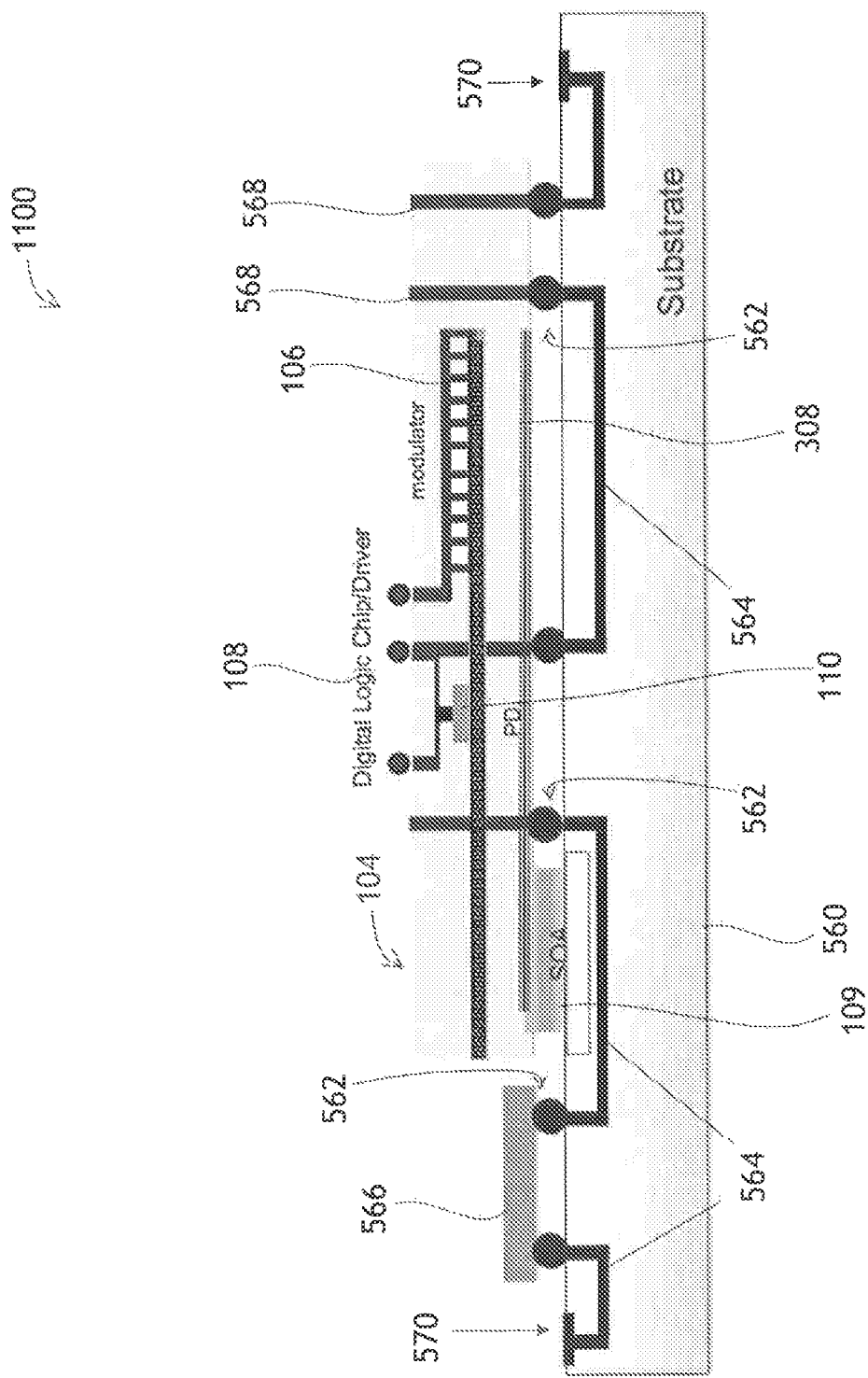
FIG. 11 is a schematic side cross-sectional view of the photonic interface assembly of FIGS. 1A and 1B including an SOA chip disposed between the substrate and the silicon photonic chip.

Referring to FIG. 11, a photonic interface assembly 1100 is another variant of the photonic interface assembly 100 of FIG. 1. The SOA chip 109 of the photonic interface assembly 1100 of FIG. 11 is disposed between the substrate 560 and the silicon photonic chip 104 and is evanescently coupled to the waveguide 308 of the silicon photonic chip 104. Alternatively, the SOA chip 109 may be disposed between the fiber support 120 (not shown in FIG. 11) and the silicon photonic chip 104.

Figure 12:
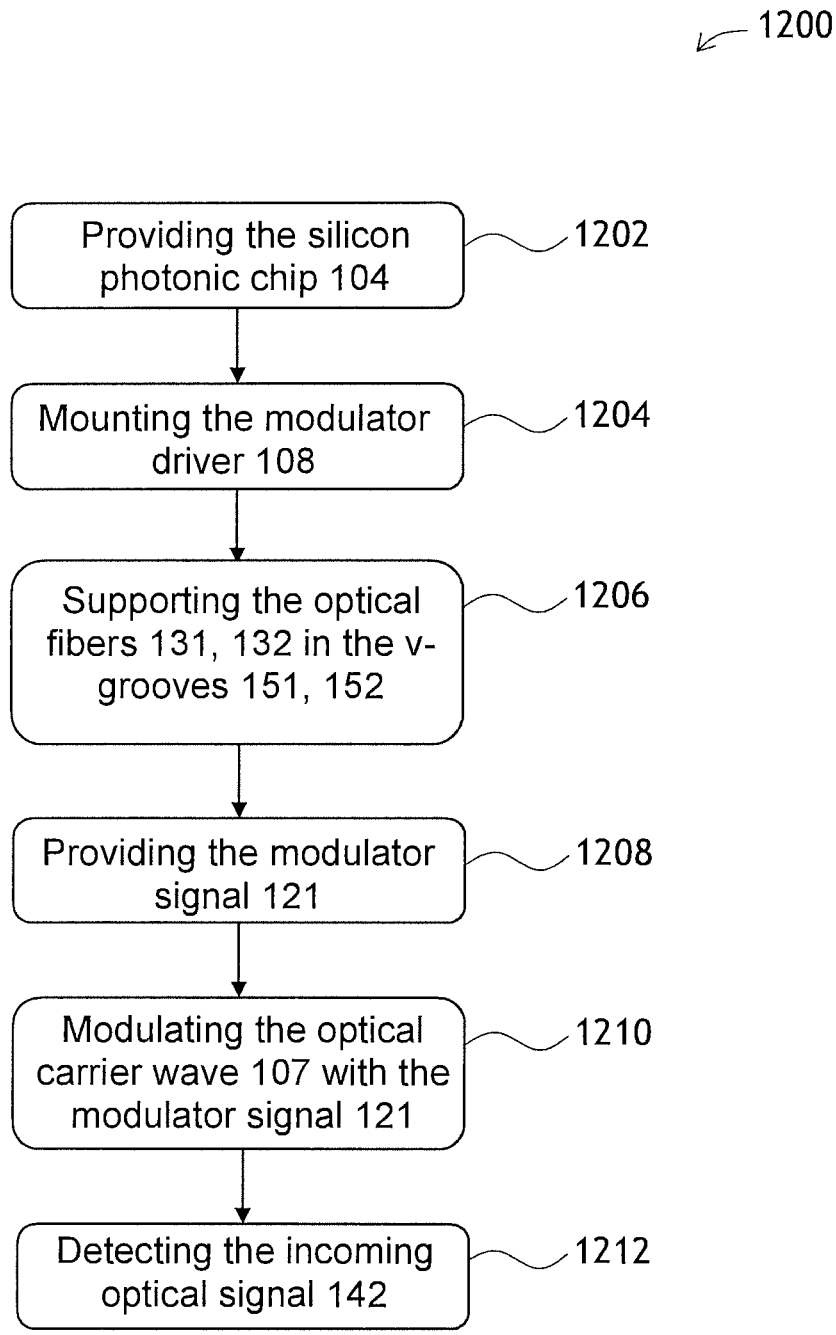
FIG. 12 is a flow chart of a method for providing a photonic interface for an electronic circuit according to the present disclosure.

Turning to FIG. 12, a method 1200 for providing a photonic interface for an electronic circuit, such as the electronic circuit 102 of FIGS. 1A and 1B, may include a step 1202 of providing the silicon photonic chip 104 having the optical modulator 106 and the photodetector 110. In an optional next step 1204, the modulator driver chip 108 is attached to the silicon photonic chip 104, and electrically coupled e.g. by microball or microbump contacts, and/or copper pillars, to the optical modulator 106 for driving the optical modulator 108. In a next step 1206, the first optical fiber 131 supported in the first v-groove 151 of the fiber support 120 is attached to the silicon photonic chip 104, so that the first optical fiber 131 is optically coupled to the optical modulator 106; and the second optical fiber 132 is supported in the second v-groove 152 of the fiber support 120, so that the second optical fiber 132 is optically coupled to the photodetector 110. As explained above, a single optical fiber may be used for bidirectional propagation of the first 141 and second 142 optical signals. In a step 1208, the first electrical signal 121 is received from the electronic circuit 102 and is provided to the modulator driver 108.

In a next step 1210, the optical carrier wave 107 is modulated with the first electrical signal 121 to provide the first optical signal 141, which is coupled to the first optical fiber 131 for propagating the first optical signal 141 in the first optical fiber 131. Finally in a last step 1212, the second optical signal 142 propagating in the second optical fiber 132 is detected with the photodetector 110 to provide the second electric signal 122, which is then coupled to the electronic circuit 102.

In one embodiment of the method 1200, the step 1206 of supporting the first 131 and second 132 optical fibers includes vertically aligning the fiber support 120 relative to the silicon photonic chip 104 using the registration features 170 extending between the fiber support 120 and the silicon photonic chip 104. The registration features 170 may be lithographically defined the fiber support 120, the silicon photonic chip 104, or both as explained above, to optically couple the optical modulator 106 to the first optical fiber 131, and to optically couple the photodetector 110 to the second optical fiber 132. More generally, the alignment, which may include both vertical and horizontal alignment, may be performed by bringing a dielectric or semiconductor hard stop lithographically defined in one of the fiber support 120 and the silicon photonic chip 104, in physical contact with the other of the fiber support 120 and the silicon photonic chip 104. The SOA chip 109 may be aligned relative to the silicon photonic chip 104 by bringing a a dielectric or semiconductor hard stop lithographically defined in one of the SOA chip 109 and the silicon photonic chip 104 in physical contact with the other of the SOA chip 109 and the silicon photonic chip 104.

Referring again to FIG. 12, now with reference to FIG. 1A, FIG. 5, and FIG. 9, the preamplifier chip 566 may be mounted and electrically coupled a to the silicon photonic chip 104 with microball or microbump contacts 562 (FIG. 5), and/or with wirebonds, not shown, and the second electrical signal 121 provided by the photodetector 110 may be amplified by the preamplifier chip 566. The silicon photonic chip 104 may be attached to the substrate 560 with the plurality of microball or microbump contacts 562 for contacting the first 111 and second 112 electrical ports (FIG. 1A). In one embodiment, the third electrical port 113 (FIG. 9) may be provided for receiving the third electrical signal 123 from the electronic circuit 102, and the fourth electrical port 114 may be provided for sending the fourth electrical signal 124 to the electronic circuit 102. To provide a suitable electrical interface, the arrayed electrical connector 902 may be attached to the substrate 560 and electrically coupled to the third 113 and fourth 114 electrical ports for connection to an external electronic unit, not shown.

It is to be understood that the silicon photonic chip 104 is only one possible example of an integrated photonic circuit. Accordingly, the silicon photonic chip 104 may be replaced in any embodiment described above with an integrated photonic circuit of another type, including without limitation, indium-phosphide (InP), gallium-arsenide (GaAs), silica (SiO2), and others. All of the exemplary embodiment disclosed herein can be used in any of these integrated photonic circuits as well. Furthermore, it is to be understood that the SOA chip 109 is only one possible example of an optical gain chip.

The present disclosure is not to be limited in scope by the specific embodiments described herein. Indeed, other various embodiments and modifications, in addition to those described herein, will be apparent to those of ordinary skill in the art from the foregoing description and accompanying drawings. Thus, such other embodiments and modifications are intended to fall within the scope of the present disclosure. Further, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes. Accordingly, the claims set forth below should be construed in view of the full breadth and spirit of the present disclosure as described herein.

What is claimed is:

1. A photonic interface assembly for providing communication between at least one optical fiber and an electronic circuit, comprising:
    a substrate including: at least one of a first and a second port, and at least one of a first and a second electrical connection electrically connected to the first and second ports, respectively, for electrically connecting to the electronic circuit;
    a photonic integrated circuit mounted on the substrate comprising:
        at least one optical port for optically coupling to the at least one optical fiber for outputting a first optical signal and/or for receiving a second optical signal;
        a third electrical connection electrically connected to the first port for receiving a first electrical signal from the electronic circuit and/or a fourth electrical connection electrically connected to the second port for coupling a second electrical signal to the electronic circuit; and
        at least one of a laser and an optical modulator for modulating an optical carrier wave with the first electrical signal to provide the first optical signal, and/or a photodetector for providing the second electrical signal in response to the second optical signal; and
    a fiber support attached to the photonic integrated circuit for optically aligning the at least one optical fiber with the at least one optical port;
    wherein the photonic integrated circuit comprises a silicon photonic chip.

2. The photonic interface assembly of claim 1, wherein the fiber support includes at least one groove of holding each of the at least one optical fiber in a pre-defined location.

3. The photonic interface assembly of claim 2, wherein at least one of the fiber support and the photonic integrated circuit comprises a first registration feature for alignment of the fiber support relative to the photonic integrated circuit.

4. The photonic interface assembly of claim 3, wherein at least one of the fiber support and the photonic integrated circuit comprises a second registration feature comprising a dielectric or semiconductor hard stop extending between the fiber support and the photonic integrated circuit for alignment of the fiber support relative to the photonic integrated circuit in the z-direction.

5. The photonic interface assembly of claim 1, further comprising an electrical preamplifier chip, electrically connected to the photodetector and the electronic circuit for amplifying the second electrical signal provided by the photodetector.

6. The photonic interface assembly of claim 1, further comprising a modulator driver chip mounted on the photonic integrated circuit electrically connected to the optical modulator and the electronic circuit for driving the optical modulator.

7. The photonic interface assembly of claim 1, further comprising an optical gain chip mounted on the substrate, and optically coupled to the optical modulator for providing the optical carrier wave.

8. The photonic interface assembly of claim 7, wherein the optical gain chip is disposed between the substrate and the photonic integrated circuit.

9. An optical interconnect between first and second electronic circuits comprising:
   a first photonic interface assembly in accordance with claim 1;
   a second photonic interface assembly in accordance with claim 1; and
   at least one optical fiber optically coupling the first and second photonic interface assemblies.

10. A photonic interface assembly for providing communication between at least one optical fiber and an electronic circuit, comprising:
    a substrate including: a first port, and a first electrical connection electrically connected to the first port, for electrically connecting to the electronic circuit;
    a photonic integrated circuit mounted on the substrate comprising:
       an optical port for optically coupling to an optical fiber for outputting a first optical signal;
       a second electrical connection electrically connected to the first port for receiving a first electrical signal from the electronic circuit; and
       at least one of a laser and an optical modulator for modulating an optical carrier wave with the first electrical signal to provide the first optical signal; and
    a fiber support attached to the photonic integrated circuit for optically aligning the optical fiber with the optical port; and
    an optical gain chip mounted on the photonic integrated circuit, and optically coupled to the optical modulator for providing or amplifying the optical carrier wave.

11. The photonic interface assembly of claim 10, wherein at least one of the optical gain chip and the photonic integrated circuit comprises a registration feature comprising a dielectric or semiconductor hard stop extending between the optical gain chip and the photonic integrated circuit for alignment of the optical gain chip relative to the photonic integrated circuit.

12. The photonic interface assembly of claim 10, wherein the photonic integrated circuit comprises a silicon photonic chip.

13. A method for coupling a photonic interface assembly between at least one optical fiber and an electronic circuit, the method comprising:
    providing a substrate including: a first and a second port, and a first and a second electrical connection electrically connected to the first and second ports, respectively, for electrically connecting to the electronic circuit;
    mounting a photonic integrated circuit on the substrate, the photonic integrated circuit comprising:
       a third and a fourth electrical connection for receiving a first electrical signal from the electronic circuit and for transmitting a second electrical signal to the electronic circuit, respectively;
       at least one optical port optically coupled to the at least one optical fiber for outputting a first optical signal and for receiving a second optical signal;
       at least one of a laser and an optical modulator for modulating an optical carrier wave with the first electrical signal to provide the first optical signal, and a photodetector for providing the second electric signal in response to the second optical signal;
       wherein the third and fourth electrical connections are connected to the first and second ports, respectively;
    optically aligning the at least one optical fiber in a fiber support to the at least one optical port on the photonic integrated circuit, wherein the at least one optical fiber is capable of outputting the first optical signal and/or receiving the second optical signal; and
    mounting an electrical preamplifier chip on the substrate or the photonic integrated circuit; and electrically connecting the electrical preamplifier chip to the photodetector and the electronic circuit for amplifying the second electrical signal provided by the photodetector.

14. The method of claim 13, wherein the optically aligning step comprises:
    horizontally aligning the fiber support relative to the photonic integrated circuit,
    wherein the horizontal alignment comprises aligning a first registration feature on the fiber support with a second registration feature on the photonic integrated circuit chip; and
    vertically aligning the fiber support relative to the photonic integrated circuit to optically couple the at least one optical port to the at least one optical fiber;
    wherein the vertical alignment comprises bringing a second dielectric or semiconductor hard stop lithographically defined in one of the fiber support and the photonic integrated circuit into physical contact with the other of the fiber support and the photonic integrated circuit in the z-direction; and
    fixing the at least one optical fiber at a pre-defined location in a groove on the fiber support.

15. The method of claim 13, further comprising
    aligning an optical gain chip relative to the photonic integrated circuit to optically couple the optical gain chip to the optical modulator for providing or amplifying an optical carrier wave to the optical modulator,
    wherein the alignment comprises bringing a dielectric or semiconductor hard stop lithographically defined in one of the optical gain chip and the photonic integrated circuit into contact with the other of the optical gain chip and the photonic integrated circuit.

16. The method of claim 15, wherein the optical gain chip is disposed between the substrate and the photonic integrated circuit.

17. The method of claim 13, further comprising mounting an electronic interposer chip, including the electrical preamplifier chip for amplifying the second electrical signal, and modular driver circuitry for driving the optical modulator between the substrate and the photonic integrated circuit.

18. The method of claim 13, further comprising mounting a modulator driver chip for driving the optical modulator on the photonic integrated circuit, and electrically connecting the modulator driver chip to the optical modulator and the electronic circuit.

19. The method of claim 13, further comprising coupling another photonic interface assembly to another end of the at least one optical fiber, thereby providing a coupling between the at least one optical fiber and another electronic circuit, and providing an optical interconnect between the electronic circuit and the other electronic circuit.

\* \* \* \* \*